United States Patent
Kim et al.

(10) Patent No.: US 10,847,226 B2
(45) Date of Patent: Nov. 24, 2020

(54) SEMICONDUCTOR DEVICE AND OPERATING METHOD OF A SEMICONDUCTOR DEVICE

(71) Applicant: SK hynix Inc., Icheon-si (KR)

(72) Inventors: Yong Jun Kim, Icheon-si (KR); Gae Hun Lee, Namyangju-si (KR); Hea Jong Yang, Seongnam-si (KR); Chan Lim, Seongnam-si (KR); Min Kyu Jeong, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 47 days.

(21) Appl. No.: 16/219,695

(22) Filed: Dec. 13, 2018

(65) Prior Publication Data

US 2019/0348121 A1 Nov. 14, 2019

(30) Foreign Application Priority Data

May 8, 2018 (KR) .................. 10-2018-0052552

(51) Int. Cl.
*G11C 16/04* (2006.01)
*G11C 16/14* (2006.01)
*H01L 27/11517* (2017.01)
*G11C 16/24* (2006.01)
*G11C 16/08* (2006.01)

(52) U.S. Cl.
CPC .......... *G11C 16/0483* (2013.01); *G11C 16/08* (2013.01); *G11C 16/14* (2013.01); *G11C 16/24* (2013.01); *H01L 27/11517* (2013.01)

(58) Field of Classification Search
CPC ..... G11C 16/0483; G11C 16/14; G11C 16/24; G11C 16/08; G11C 16/32; H01L 27/11517
See application file for complete search history.

(56) References Cited

U.S. PATENT DOCUMENTS

| | | | |
|---|---|---|---|
| 2011/0194357 A1* | 8/2011 | Han ................... | G11C 16/16 365/185.29 |
| 2012/0134210 A1* | 5/2012 | Maeda ................ | G11C 16/26 365/185.11 |
| 2016/0141035 A1* | 5/2016 | Shim .................. | G11C 16/10 365/185.11 |

FOREIGN PATENT DOCUMENTS

| KR | 1020130008220 A | 1/2013 |
|---|---|---|
| KR | 101742790 B1 | 6/2017 |

* cited by examiner

*Primary Examiner* — Mohammed A Bashar
(74) *Attorney, Agent, or Firm* — William Park & Associates Ltd.

(57) ABSTRACT

A semiconductor device includes a memory string coupled between a common source line and a bit line, the memory string including at least one first selection transistor, a plurality of memory cells, and a plurality of second selection transistors. The semiconductor device also includes selection lines respectively coupled to the second selection transistors. The semiconductor device further includes a control logic circuit configured to float a first group of selection lines from among the selection lines at a first time and configured to float a second group of selection lines from among the selection lines at a second time different from the first time.

20 Claims, 12 Drawing Sheets

|    | SSL1/SST1 | SSL2/SST2 | SSL3/SST3 | SSL4/SST4 | SSL5/SST5 | SSL6/SST6 | SSL7/SST7 |
|----|-----------|-----------|-----------|-----------|-----------|-----------|-----------|
| E1 | G1        | G1        | G1        | G1        | G1        | G2        | G2        |
| E2 | G1        | G1        | G1        | G1        | G2        | G2        | G2        |
| E3 | G1        | G1        | G1        | G2        | G2        | G2        | G2        |
| E4 | G1        | G1        | G2        | G2        | G2        | G2        | G2        |

SEMICONDUCTOR DEVICE AND OPERATING METHOD OF A SEMICONDUCTOR DEVICE

CROSS-REFERENCE TO RELATED APPLICATION

The present application claims priority under 35 U.S.C. § 119(a) to Korean patent application number 10-2018-0052552, filed on May 8, 2018, the entire disclosure of which is incorporated herein by reference in its entirety.

BACKGROUND

1. Technical Field

Various embodiments of the present disclosure relate to an electronic device, and more particularly, to a semiconductor device and a method of operating the semiconductor device.

2. Related Art

Semiconductor memory devices are storage devices made of semiconductor materials such as silicon (Si), germanium (Ge), gallium arsenide (GaAs), and indium phosphide (Inp). Semiconductor memory devices are classified into volatile memory devices and non-volatile memory devices.

Volatile memory devices lose stored data in the absence of power. Examples of volatile memory devices may include Static RAM (SRAM), Dynamic RAM (DRAM), and Synchronous DRAM (SDRAM). Non-volatile memory devices can retain stored data in the absence of power. Examples of non-volatile memory devices include Read Only Memory (ROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories may be classified into NOR-type memories and NAND-type memories.

SUMMARY

In accordance with an embodiment, a semiconductor device may include a memory string coupled between a common source line and a bit line, the memory string including at least one first selection transistor, a plurality of memory cells, and a plurality of second selection transistors. The semiconductor device may further include selection lines individually coupled to the second selection transistors. The semiconductor device may also include a control logic circuit configured to float a first group of selection lines from among second selection lines respectively coupled to the second selection transistors at a first time and configured to float a second group of selection lines from among the second selection lines at a second time different from the first time.

In accordance with another embodiment, a semiconductor device may include a memory string coupled between a common source line and a bit line, the memory string including at least one first selection transistor, a plurality of memory cells, and a plurality of second selection transistors. The semiconductor device may further include a control logic circuit configured to apply a first gate induced drain leakage (GIDL) bias to a first group of second selection transistors from among the second selection transistors, and configured to apply a second GIDL bias different from the first GIDL bias to a second group of second selection transistors from among the second selection transistors.

In accordance with an additional embodiment, a semiconductor device may include memory strings coupled between a common source line and a bit line, the memory strings each including at least one first selection transistor, a plurality of memory cells, and a plurality of second selection transistors. A method of operating the semiconductor device includes applying an erase voltage to at least one of the common source line and the bit line. The method also includes floating, at a first time, a first group of selection lines from among selection lines individually coupled to the second selection transistors. The method further includes floating, at a second time different from the first time, a second group of selection lines from among the selection lines individually coupled to the second selection transistors.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

Various embodiments of the present teachings may be directed to a semiconductor device having improved reliability and increased operating speed, and a method of operating the semiconductor device.

Example embodiments are described with reference to the accompanying drawings. However, the embodiments may be embodied in different forms and should not be construed as being limited to the embodiments set forth herein. Rather, these embodiments are provided so that this disclosure is enabling for those skilled in the art. Various embodiments are described in detail with reference to the accompanying drawings. In the following description, a detailed explanation of related functions and constitutions may be omitted for simplicity and conciseness. In addition, embodiments may be embodied in different forms and should not be construed as limited to the embodiments presented herein.

In this specification, "connected/coupled" refers to one component not only directly coupled to another component but also indirectly coupled to another component through an intermediate component. In the specification, when an element is referred to as "comprising" or "including" a component, it does not exclude other components, and the element may further include other components unless the associated description indicates the contrary.

Figure 1:
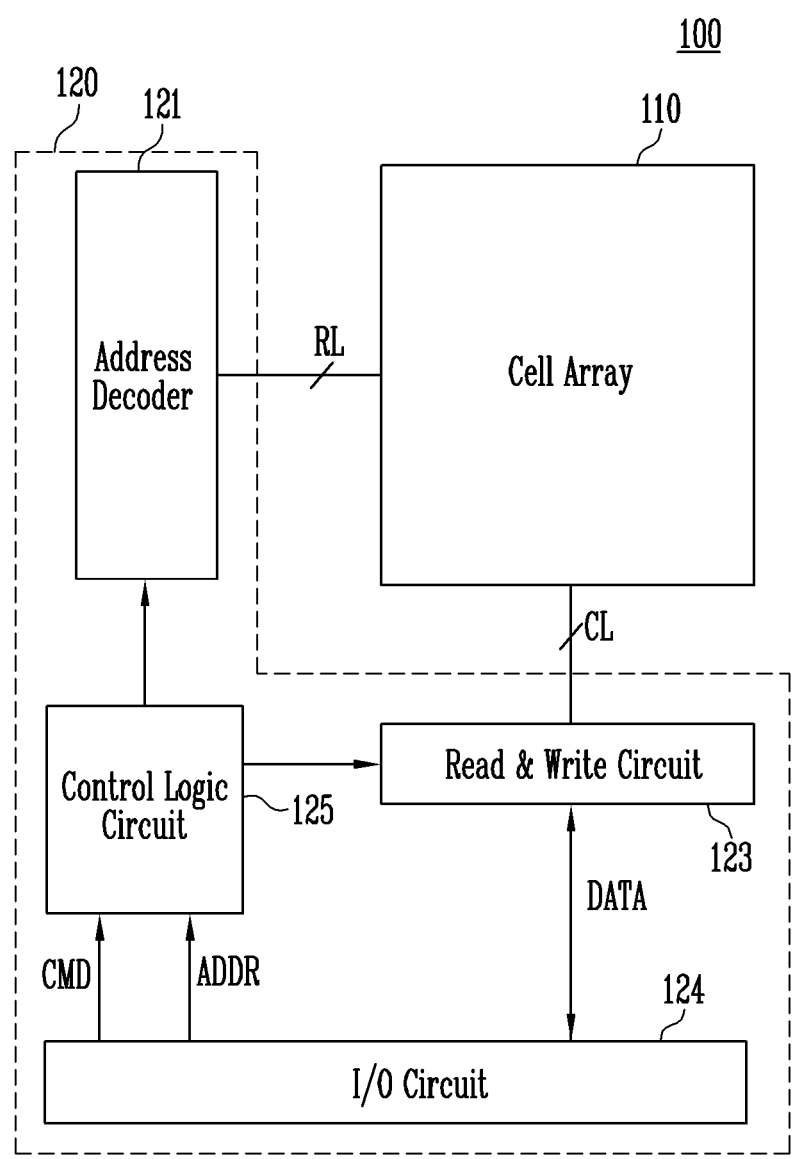
FIG. 1 shows a block diagram illustrating a configuration of a memory system, according to an embodiment of the present disclosure.

FIG. 1 shows a block diagram illustrating a configuration of a semiconductor device 100, according to an embodiment. Referring to FIG. 1, the semiconductor device 100 may include a cell array 110 and a peripheral circuit 120.

The cell array 110 may be coupled to an address decoder 121 through row lines RL and to a read and a write circuit 123 through column lines CL. The row lines RL may be a drain selection line, a word line, or a source selection line, and the column lines CL may be bit lines. In addition, the read and write circuit 123 may be a page buffer.

The cell array 110 may include a plurality of memory strings, and the plurality of memory strings may be arranged in a horizontal direction or a vertical direction with respect to a substrate. Additionally, the cell array 110 may include a plurality of memory blocks, and each of the plurality of memory blocks may include a plurality of pages. For example, the semiconductor device 100 may perform an erase operation in units of memory blocks, and it may perform a program operation or a read operation in units of pages.

The peripheral circuit 120 may include the address decoder 121, the read and write circuit 123, an input/output (I/O) circuit 124, and a control logic circuit 125.

The control logic circuit 125 may be coupled to the address decoder 121, the read and write circuit 123, and the input/output circuit 124. The control logic circuit 125 may receive a command CMD and an address ADDR from the input/output circuit 124 and may control the address decoder 121 and the read and write circuit 123 to perform an internal operation in response to the received command CMD.

The control logic circuit 125 may float selection lines at different times when performing an erase operation. For example, the control logic circuit 125 may float a first group, among the selection lines, at a first time, and may float a second group, among the selection lines, at a second time different from the first time. In other words, the control logic circuit 125 may delay floating times of some selection lines. A selection line may be either or both of a source selection line and a drain selection line.

The control logic circuit 125 may apply a Gate Induced Drain Leakage (GIDL) bias to selection transistors during an erase operation. The GIDL bias may be a reverse bias for generating a GIDL current in a selection transistor and may refer to a voltage difference between a gate terminal and a source terminal of the selection transistor. The control logic circuit 125 may apply a first GIDL bias to the first group, among the selection transistors, and a second GIDL bias to the second group, among the selection transistors. In other words, the control logic circuit 125 may increase a GIDL bias applied to some of the selection transistors. Herein, a selection transistor may be either or both of a source selection line and a drain selection line.

According to the above-described control method, a GIDL current generated during the erase operation may be increased. Therefore, a sufficient amount of holes may be supplied to memory cells during an erase operation, and operational characteristics of the semiconductor device 100 may be improved. In addition, a variation in a threshold voltage of a selection transistor by Hot Carrier Injection (HCI) may be prevented. Therefore, reliability of the semiconductor device 100 may be improved.

The address decoder 121 may be coupled to the cell array 110 through the row lines RL and control the row lines RL in response to control of the control logic circuit 125. Therefore, the address decoder 121 may receive the address ADDR from the control logic circuit 125 and select one of the memory blocks of the cell array 110 in response to the received address ADDR.

A program operation and a read operation of the semiconductor device 100 may be performed in units of pages. Therefore, during the program operation and the read operation, the address ADDR may include a block address and a row address. The address decoder 121 may decode the block address included in the address ADDR and select one of the memory blocks according to the decoded block address. The address decoder 121 may decode the row address included in the received address ADDR and select one of the pages of the selected memory block according to the decoded row address.

An erase operation of the semiconductor device 100 may be performed in units of memory blocks. Therefore, during the erase operation, the address ADDR may include a block address. The address decoder 121 may decode the block address and select one of the memory blocks according to the decoded block address.

The read and write circuit 123 may be coupled to the cell array 110 through the column lines CL. During a program operation, the read and write circuit 123 may transfer data DATA received from the input/output circuit 124 to the column lines CL, and memory cells of the selected page may be programmed with the transferred data DATA. During a read operation, the read and write circuit 123 may read the data DATA from the memory cells of the selected page through the column lines CL and output the read data DATA to the input/output circuit 124. In an erase operation, the read/write circuit 123 may apply an erase voltage to the column lines CL.

Figure 2A:
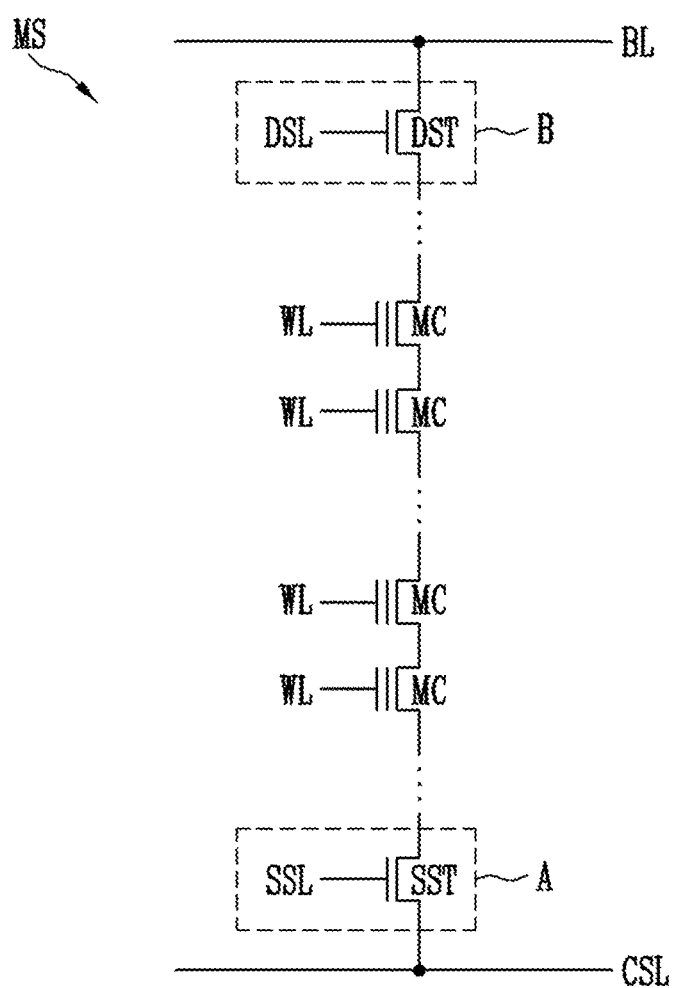
FIGS. 2A to 2C show circuit diagrams illustrating a cell array structure of a semiconductor device, according to an embodiment of the present disclosure.
Figure 2B:
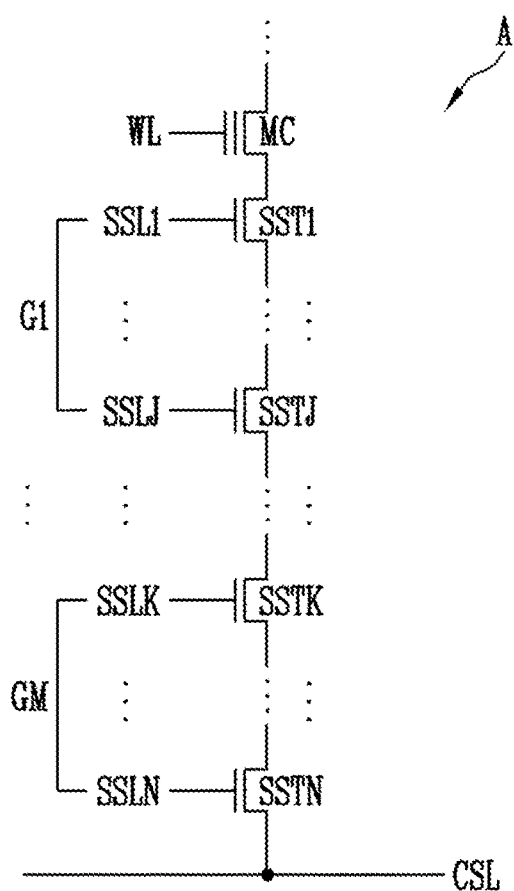
Figure 2C:
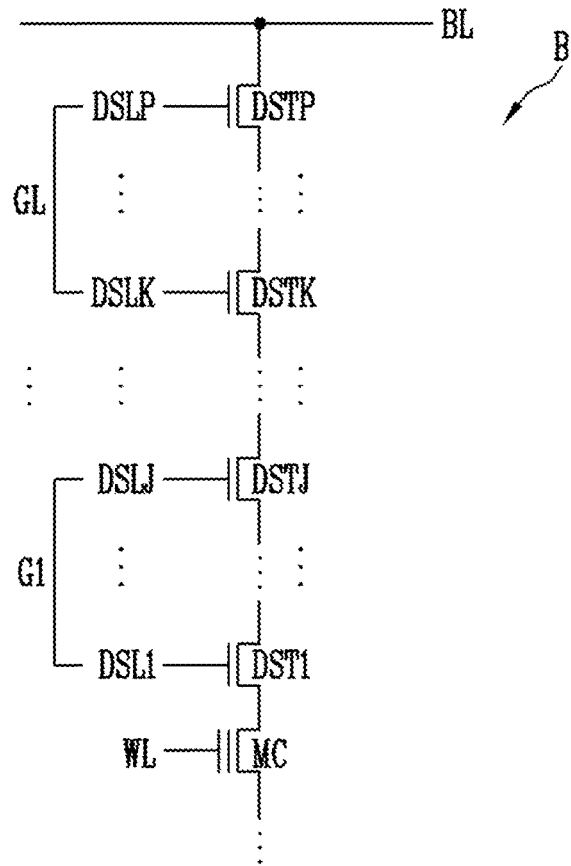

FIGS. 2A to 2C show circuit diagrams illustrating a cell array structure of the semiconductor device 100 according to an embodiment of the present disclosure. FIG. 2B shows an area A of FIG. 2A, and FIG. 2C shows an area B of FIG. 2A.

Referring to FIG. 2A, a memory string MS may be coupled between a bit line BL and a common source line CSL. In addition, the memory string MS may include at least one drain selection transistor DST, a plurality of memory cells MC, and at least one source selection transistor SST coupled in series with each other. Though not shown in FIG. 2A, the memory string MS may further include a pipe transistor located between the plurality of memory cells MC.

Word lines WL may be coupled to gate electrodes of the memory cells MC. A drain selection line DSL may be coupled to a gate electrode of a drain selection transistor DST and control the connection between the memory string MS and the bit line BL. A source selection line DSL may be coupled to a gate electrode of a source selection transistor SST and control the connection between the memory string MS and the common source line CSL.

The number of source selection transistors SST included in one memory string MS may be the same as or different from the number of drain selection transistors DST. The number of source selection transistors SST may be greater than the number of drain selection transistors, or the number of drain selection transistors DST may be greater than the number of source selection transistors SST. For example, one memory string MS may include seven source selection transistors SST and three drain selection transistors DST.

At least one of the source selection transistors SST may be a dummy source selection transistor, and at least one of the drain selection transistors DST may be a dummy drain selection transistor.

Referring to FIG. 2B, one memory string MS may include a plurality of source selection transistors SST1 to SSTN, and a plurality of source selection lines SSL1 to SSLN may be coupled to gate electrodes of the plurality of source selection transistors SST1 to SSTN, respectively.

The source selection lines SSL1 to SSLN may be grouped into a plurality of groups G1 to GM, and each of the groups G1 to GM may include at least one of the source selection lines SSL1 to SSLN. For example, first to Jth source selection lines SSL1 to SSLJ may belong to a first group G1, and Kth to Nth source selection lines SSLK to SSLN may belong to an Mth group GM. In addition, the groups G1 to GM may include different numbers of source selection lines (SSL1 to SSLN). In the same manner, the source selection transistors SST1 to SSTN may be divided into a plurality of groups G1 to GM, and each of the groups G1 to GM may include at least one of the source selection transistors SST1 to SSTN. Here, J, K, M, and N may be integers of two or more such that J<K<N is satisfied.

At least one of the groups G1 to GM may include a dummy source selection transistor. For example, the group G1, which is relatively adjacent to a word line WL, may include a dummy source selection transistor. In addition, an entirety or a portion of source selection transistors SST1 to SSTJ included in the corresponding group G1 may be dummy source selection transistors.

Referring to FIG. 2C, one memory string MS may include a plurality of drain selection transistors DST1 to DSTP, and a plurality of drain selection lines DSL1 to DSLP may be coupled to gate electrodes of the plurality of drain selection transistors DST1 to DSTP, respectively.

The drain selection lines DSL1 to DSLP may be grouped into a plurality of groups G1 to GL, and each of the groups G1 to GL may include at least one of the drain selection lines DSL1 to DSLP. For example, the first to Jth drain selection lines DSL1 to DSLJ may belong to the first group G1, and Kth to Pth drain selection lines DSLK to DSLP may belong to an Lth group GL. In addition, the groups G1 to GL may include different numbers of drain selection lines (DSL1 to DSLP). In the same manner, the drain selection lines DST1 to DSTP may be grouped into the plurality of groups G1 to GL, and each of the groups G1 to GL may include at least one of the drain selection transistors DST1 to DSTP. Here, J, K, L, and P may be integers of two or more such that J<K<P is satisfied.

At least one of the groups G1 to GL may include drain selection transistor. For example, a group, which is relatively adjacent to the word line WL, among the groups G1 to GL, may include a dummy drain selection transistor. In addition, an entirety or a portion of drain selection transistors DSTK to DSTP included in the group may be dummy drain selection transistors.

The number of groups G1 to GM of the source selection lines SSL1 to SSLN corresponding to one memory string MS may be the same as or different from the number of groups G1 to GL of the drain selection lines DSL1 to DSLP. For example, the source selection lines SSL1 to SSLN may be grouped into two groups, and the drain selection lines DSL1 to DSLP may be grouped into a single group.

Figure 3:
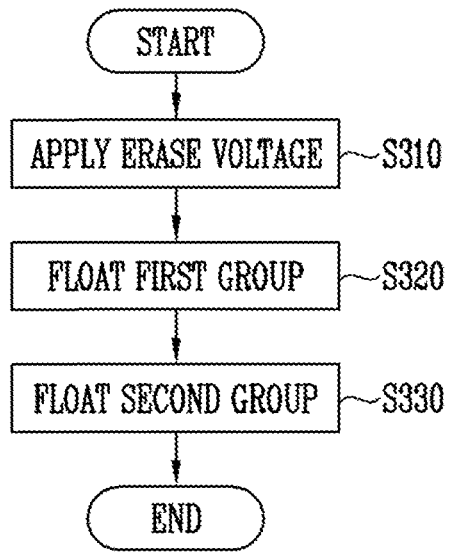
FIG. 3 shows a flowchart illustrating a method of operating a semiconductor device, according to an embodiment of the present disclosure.

As used herein, "selection lines" can refer to source selection lines or drain selection lines. Similarly, "selection transistors" can refer to source selection transistors or drain selection transistors. Further, a set of selection transistors can include a plurality of selection transistors or only one selection transistor. For example, a set of selection transistors can include one or more source selection transistors or one or more drain selection transistors. In some embodiments, selection lines being individually coupled to selection transistors indicates a one-to-one coupling between selection lines and selection transistors. A control logic circuit can be implemented using hardware, software, or a combination thereof. Further, a control logic circuit, as used herein for some embodiments, can refer to a single circuit, compound circuits, processors, or a combination thereof. The word "closer" as used herein for some embodiments, indicates a smaller electrical distance along a memory string. For example, a first selection line being closer to a source selection line than a second selection line means that the electrical distance between the first selection line and the source selection line along a memory string is less than the electrical distance between the second selection line and the source selection line along the memory string FIG. 3 shows a flowchart illustrating a method of operating a semiconductor device, according to an embodiment. An erase operation performed on two groups into which a plurality of source selection lines are grouped is described below with reference to the cell array 110 shown in FIG. 2B.

First, an erase voltage V_ERS is applied S310 to the common source line CSL. A ground voltage may be applied to the source selection lines SSL1 to SSLN and the word lines WL. Subsequently, the source selection lines SSL1 to SSLJ in the first group G1, among the source selection lines SSL1 to SSLN, is floated S320. Subsequently, the source selection lines SSLK to SSLN in the second group G2, among the source selection lines SSL1 to SSLN, is floated S330.

According to the above described operating method, a GIDL current may be generated by a voltage difference between a gate terminal and a source terminal of a source selection transistor (SST1 to SSTN), i.e., a GIDL bias. Holes generated by the GIDL current may flow into a channel of the memory cells MC and tunnel into a data storage layer of each memory cell MC, so that data of the memory cells MC may be erased.

In addition, the source selection lines SSL1 to SSLJ in the first group G1 and the source selection lines SSLK to SSLN in the second group G2 might not be floated at the same time. Floating of the second group G2 may be delayed. Therefore, the GIDL current generated from the source selection transistors SSTK to SSTN corresponding to the second group G2 may be increased. In other words, the amount of holes generated from the source selection transistors SSTK to SSTN may be increased. However, floating of the first group G1 may also be delayed. As a result, a variation of threshold voltages of the source selection transistors SST1 to SSTJ caused by HCI may be prevented.

In this embodiment, a method of performing an erase operation on groups into which the source selection lines SSL1 to SSLN are grouped is described. However, this erase operation method may also be applicable to the drain selection lines DSL1 to DSLP. For example, an erase voltage V_ERS may be applied to the bit line BL, and the drain selection lines DSL1 to DSLP may be floated by groups. Therefore, the GIDL bias, the GIDL current, and threshold voltage variations of the drain selection transistors DST1 to DSTP may be controlled.

In addition, in this embodiment, the source selection lines SSL1 to SSLN may be grouped into two groups. However, the source selection lines SSL1 to SSLN may be grouped into three or more groups.

Figure 4A:
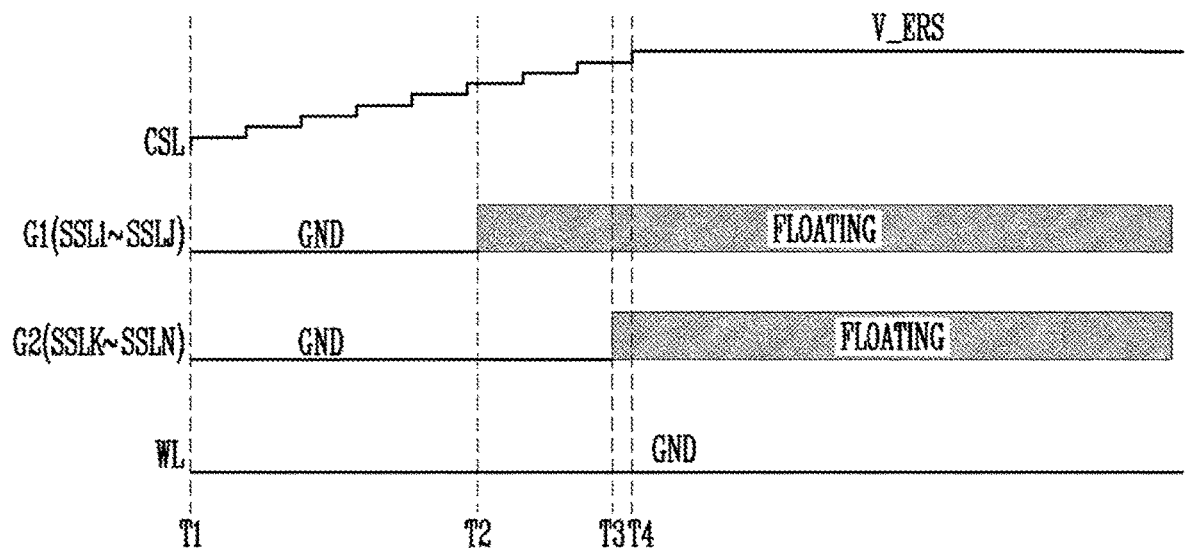
FIGS. 4A and 4B show timing diagrams illustrating a method of operating a semiconductor device, according to an embodiment of the present disclosure.
Figure 4B:
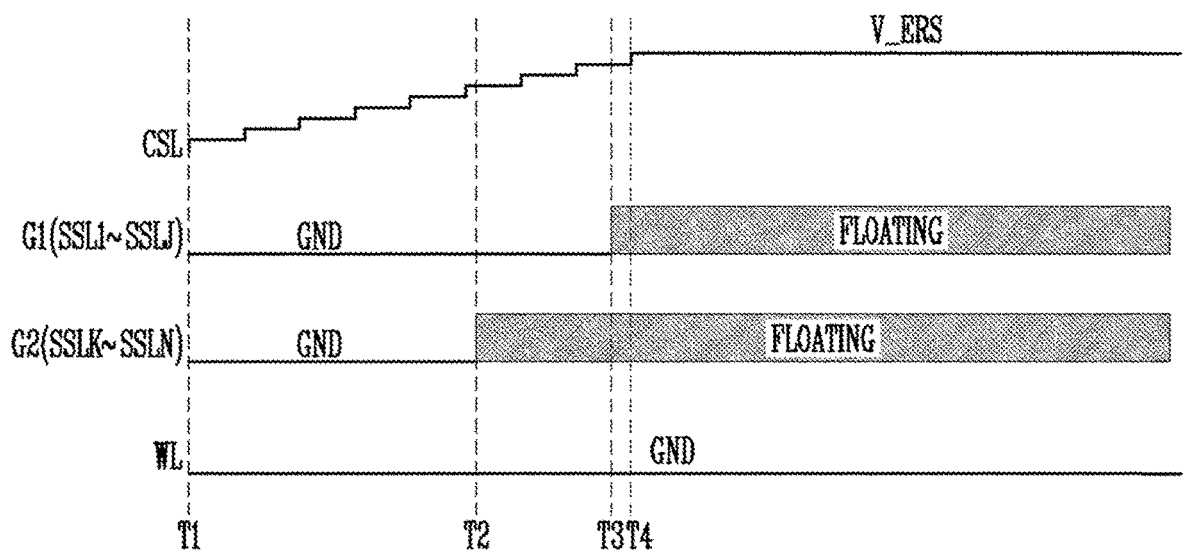

FIGS. 4A and 4B show timing diagrams illustrating a method of operating a semiconductor device, according to an embodiment of the present disclosure. An erase operation performed on two groups into which a plurality of source selection lines are grouped is described below with reference to the cell array 110 shown in FIGS. 1 and 2B.

Referring to FIG. 4A, the erase voltage V_ERS may be applied to the common source line CSL at a first time T1. A potential of the erase voltage V_ERS may be increased stepwise as shown. A ground voltage GND may be applied to the source selection lines SSL1 to SSLN in the first and second groups G1 and G2 and the word lines WL.

The source selection lines SSL1 to SSLJ in the first group G1 may be floated at a second time T2. Therefore, when the potential of the erase voltage V_ERS increases, potentials of the source selection lines SSL1 to SSLJ may also be increased by coupling. In other words, a voltage difference between a gate terminal and a source terminal of each of the source selection transistors SST1 to SSTJ at the second time T2 may be maintained, and a first GIDL bias may be applied to the source selection transistors SST1 to SSTJ.

However, a ground voltage may still be applied to the source selection lines SSLK to SSLN of the second group G2. Therefore, as the potential of the erase voltage V_ERS increases, the voltage difference between the gate terminal and the source terminal of each of the source selection transistors SSTK to SSTN may also increase.

The source selection lines SSLK to SSLN of the second group G2 may be floated at a third time T3. Therefore, when the potential of the erase voltage V_ERS increases, potentials of the source selection lines SSLK to SSLN may also be increased by coupling. In other words, a voltage difference between a gate terminal and a source terminal of each of the source selection transistors SSTK to SSTN at the third time T3 may be maintained, and a second GIDL bias may be applied to the source selection transistors SSTK to SSTN.

At a fourth time T4, the potential of the erase voltage V_ERS might no longer increase and might be maintained.

According to the above-described conditions, the GIDL current may be generated by the source selection transistors SST1 to SSTN, and data may be erased by supplying holes to memory cells.

In addition, the erase voltage V_ERS may increase during a period T1 to T4, and the source selection lines SSL1 to SSLN may be floated in the period T1 to T4. A GIDL bias value applied to the source selection transistors SST1 to SSTN may be controlled depending on the time at which the source selection lines SSL1 to SSLN are floated.

For example, as a floating time at which the second group G2 is floated is delayed, the voltage difference between the gate terminal and the source terminal of each of the source selection transistors SSTK to SSTN may be increased. Therefore, the GIDL bias applied to the source selection transistors SSTK to SSTN of the second group G2 may be more increased in comparison with the first group G1, and the GIDL current generated in the source selection transistors SSTK to SSTN of the second group G2 may be selectively increased. In other words, the amount of holes generated from the source selection transistors SSTK to SSTN adjacent to the common source line CSL may be increased.

Although the embodiment of FIG. 4B is similar to that of FIG. 4A, the first group G1 and the second group G2 may be floated in a different order. More specifically, referring to FIG. 4B, the source selection lines SSLK to SSLN in the second group G2 may be floated at the first time T1, and the source selection lines SSL1 to SSLJ in the first group G1 may be floated at the second time T2.

As described above, when the floating of the source selection lines SSL1 to SSLJ in the first group G1 is delayed, a high GIDL bias may be applied to the source selection transistors SST1 to SSTJ in the first group G1. As a result, the GIDL bias applied to the first group G1 may be relatively increased, and the GIDL bias applied to the second group G2 may be relatively reduced. In addition, a bias difference between the source selection lines SSLK to SSLN in the second group G2 and the common source line CSL may be reduced, and a bias difference between the source selection lines SSL1 to SSLJ of the first group G1 and the word line WL may be reduced. As a result, HCI may be prevented, and a variation in threshold voltages of the source selection transistors SSTK to SSTN adjacent to the word line WL caused by HCI may be prevented.

In this embodiment, a method of performing an erase operation on groups into which the source selection lines SSL1 to SSLN are grouped is described. However, this erase operation method may also be applicable to the drain selection lines DSL1 to DSLP. In addition, in this embodiment, the source selection lines SSL1 to SSLN may be grouped into two groups. However, the source selection lines SSL1 to SSLN may be grouped into three or more groups.

Figures 5A, 5B:
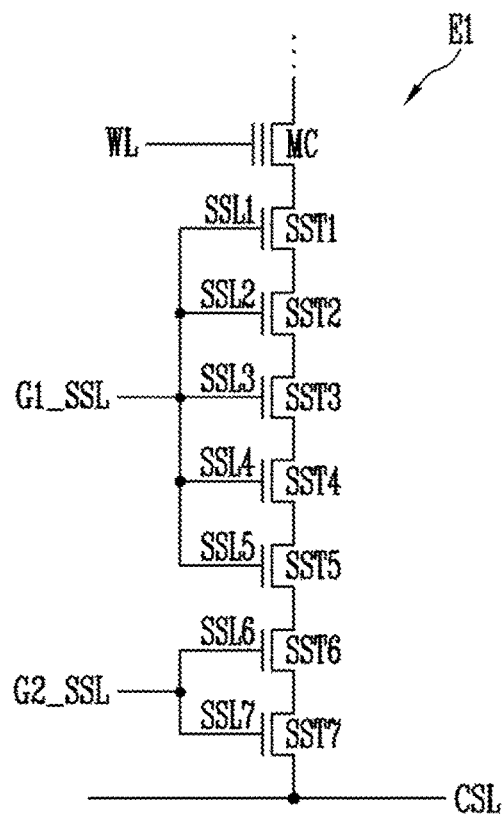
FIGS. 5A and 5B show diagrams illustrating a method of grouping a plurality of select transistors, according to an embodiment of the present disclosure.

FIGS. 5A and 5B show diagrams illustrating a grouping method, according to an embodiment.

As described above, floating times of some selection lines may be delayed during an erase operation, or a GIDL bias applied to some selection transistors may be increased. However, because the corresponding selection transistors are repeatedly exposed to a high voltage, these selection transistors may be damaged as the erase operation is repeated. Therefore, according to an embodiment, selection transistors and selection lines corresponding thereto may be grouped so as to reduce erase stress.

Referring to FIGS. 5A and 5B, the memory string MS may include seven source selection transistors SST1 to SST7, and the connection between the memory string MS and the common source line CSL may be controlled by seven source selection lines SSL1 to SSL7. In addition, the groups G1 and G2 may collectively include the source selection lines SSL1 to SSL7 corresponding to the source selection transistors SST1 to SST7. The first group G1 may include some of the source selection lines SSL1 to SSL7 and the second group G2 may include other source selection lines of the source selection lines SSL1 to SSL7.

Referring to a first embodiment E1, the first to fifth source selection transistors SST1 to SST5 and the first to fifth source selection lines SSL1 to SSL5 corresponding thereto may constitute the first group G1. The first to fifth source selection lines SSL1 to SSL5 may be commonly controlled by a first group source selection line G1_SSL.

In addition, sixth and seventh source selection transistors SST6 and SST7 and sixth and seventh source selection lines SSL6 and SSL7 corresponding thereto may constitute the second group G2. The sixth and seventh source selection lines SSL6 and SSL7 pertaining to the second group G2 may be commonly controlled by a second group source selection line G2_SSL.

In addition, referring to second to fourth embodiments E2 to E4, shown by FIG. 5B, the number of groups (G1 and G2) corresponding to one memory string and the number of selection lines (SSL1 to SSL7) included in each group (G1 and G2) may vary.

As described above, by controlling the number of source selection transistors (SST1 to SST7) or the number of source selection lines (SSL1 to SSL7) to be different from each other, a smaller number of source selection transistors (SST1 to SST7) or the number of source selection lines (SSL1 to SSL7) may be included in a group with high erase stress. In other words, a smaller number of source selection lines may be included in a group where a floating time is delayed or a group to which a high GIDL bias is applied. For example, when a floating time of the second group G2 is delayed, a small number of source selection lines (SSL6 and SSL7) may be included in the second group G2.

Grouping may be performed when manufacturing a semiconductor device or when a program/erase cycle is repeated a predetermined number of times. A grouping table may be stored in a memory device or transferred from a controller.

In a presented embodiment, a method of grouping seven source selection transistors included in one memory string is described. However, the number of source selection transistors may vary. In addition, the grouping method may also apply to drain selection transistors.

Figure 6:
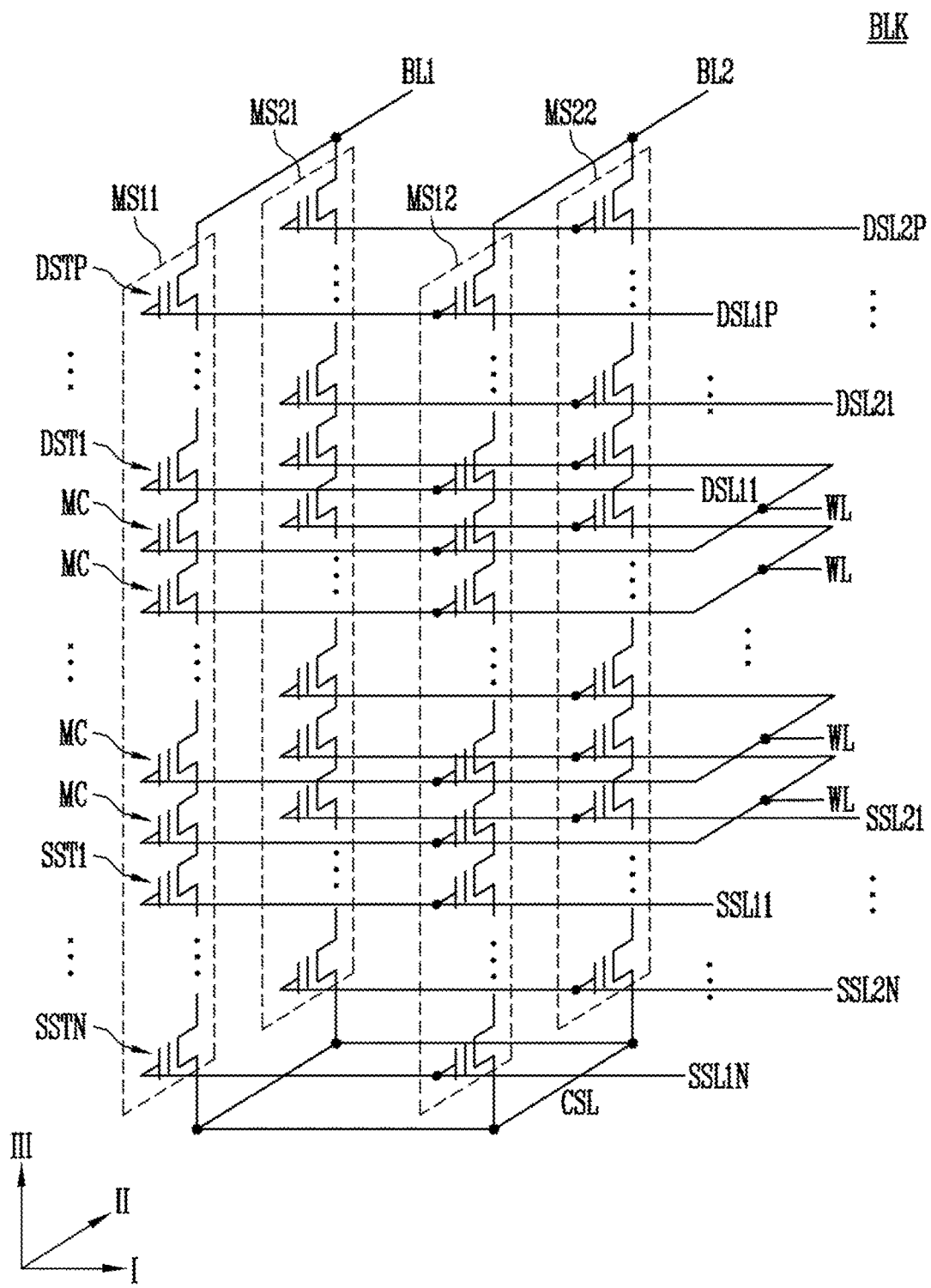
FIG. 6 shows a circuit diagram illustrating a cell array structure of a semiconductor device, according to an embodiment of the present disclosure.

FIG. 6 shows a circuit diagram illustrating a cell array structure of the semiconductor device 100, according to an embodiment of the present disclosure.

Referring to FIG. 6, the cell array 110 may include a plurality of memory blocks BLK, and each of the memory blocks BLK may include a plurality of memory strings MS11 to MS22. For example, a first memory block BLK1 may include the memory strings MS11 to MS22 arranged in a first direction I and a second direction II. In addition, each of the memory strings MS11 to MS22 may extend in a third direction III. The first direction I may be a row direction, the second direction II may be a column direction, and the third direction III may be a stacking direction.

The plurality of memory strings MS11 to MS22 may be coupled between bit lines BL1 and BL2 and the common source line CSL. In addition, each of the memory strings MS11 to MS22 may include at least one source selection transistor (SST1 to SSTN), the memory cells MC, and at least one drain selection transistor (DST1 to DSTP). Gate electrodes of the memory cells MC may be coupled to the word lines WL.

The memory strings MS11 to MS22 included in one memory block BLK1 may be coupled in common to the common source line CSL. In addition, connections between the memory strings MS11 to MS22 and the common source line CSL may be respectively controlled by the source selection lines SSL11 and SSL2N.

The source selection transistors SST1 to SSTN of first memory strings MS11 and MS12 arranged in the first row may be coupled to first source selection lines SSL11 to SSL1N. The source selection transistors SST1 to SSTN of second memory strings MS21 and MS22 arranged in the second row may be controlled by second source selection lines SSL21 to SSL2N. The first source selection lines SSL11 to SSL1N may be grouped into a plurality of groups, and each group may be controlled. In the same manner, the second source selection lines SSL21 to SSL2N may be grouped into a plurality of groups, and each group may be controlled. For example, the respective groups may be floated at different times during an erase operation, and different GIDL biases may be applied to the groups.

The memory strings MS11 to MS22 included in one memory block BLK1 may be coupled to the bit lines BL1 and BL2. In addition, the respective connections between the plurality of memory strings MS11 to MS22 and the bit lines BL1 and BL2 may be controlled by drain selection lines DSL11 to DSL2P.

The drain selection transistors DST1 to DSTP of the first memory strings MS11 and MS12 arranged in the first row may be controlled by first drain selection lines DSL11 to DSL1P. The drain selection transistors DST1 to DSTP of the second memory strings MS21 and MS22 arranged in the second row may be coupled to second drain selection lines DSL21 to DSL2P. The first drain selection lines DSL11 to DSL1P may be grouped into a plurality of groups, and each group may be controlled. In the same manner, the second source selection lines DSL21 to DSL2P may be grouped into a plurality of groups, and each group may be controlled. For example, the respective groups may be floated at different times during an erase operation, and different GIDL biases may be applied to the groups.

Figure 7:
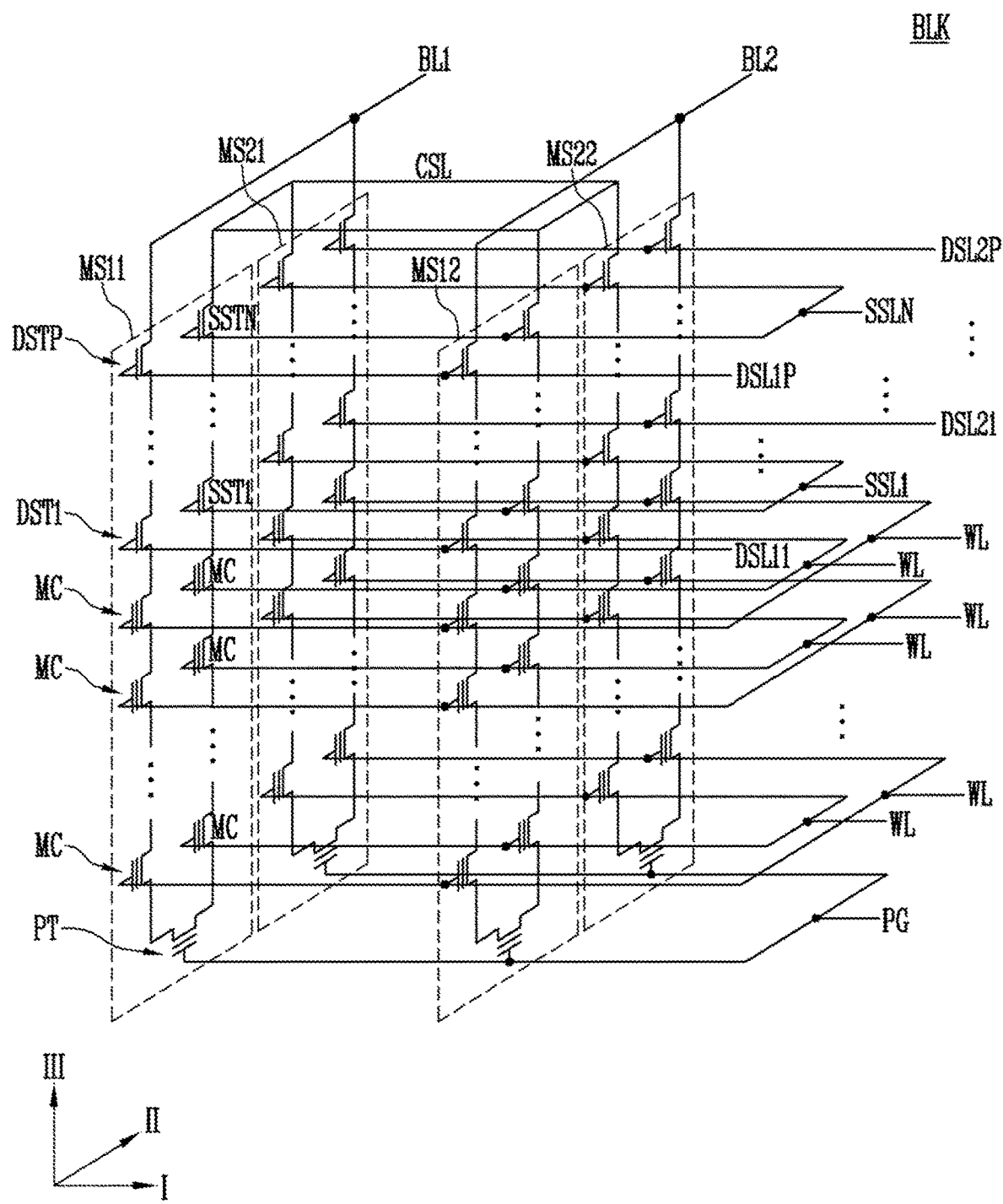
FIG. 7 shows a circuit diagram illustrating a cell array structure of a semiconductor device, according to an embodiment of the present disclosure.

FIG. 7 shows a circuit diagram illustrating a cell array structure of the semiconductor device 100 according to an embodiment of the present disclosure. Hereinafter, repetitive descriptions of components already described above are omitted.

Referring to FIG. 7, the cell array 110 may include the plurality of memory blocks BLK. Each of the memory blocks BLK may include the plurality of cell strings MS11 to MS22. In addition, each of the memory strings MS11 to MS22 may be arranged in a shape of the letter "U."

In addition, each of the memory strings MS11 to MS22 may include at least one source selection transistor (SST1 to SSTN), the memory cells MC, and at least one drain selection transistor (DST1 to DSTP).

The memory cells MC may be stacked in the third direction III crossing the first direction I and the second direction II. In addition, the memory cells MC may be coupled in series between a source selection transistor SST1 and a pipe transistor PT and between the pipe transistor PT and the drain selection transistor DST1. In addition, gate electrodes of the memory cells MC may be coupled to the word lines WL, respectively. Gate electrodes of the pipe transistors PT may be coupled to a gate of a pipe gate PG.

The source selection transistors SST1 to SSTN of the memory strings MS11 to MS22 arranged in the same row may be controlled by the first source selection lines SSL1 to SSLN extending in the same row direction. The source selection lines SSL1 to SSLN may be grouped into a plurality of groups, and each group may be controlled. For example, the respective groups may be floated at different times during an erase operation, and different GIDL biases may be applied to the groups.

The drain selection transistors DST1 to DSTP of the memory strings MS11 to MS22 arranged in the same row may be controlled by the drain selection lines DSL11 to DSL2P extending in the same row direction. The drain selection lines DSL11 to DSL2P may be grouped into a plurality of groups, and each group may be controlled. For example, the respective groups may be floated at different times during an erase operation, and different GIDL biases may be applied to the groups.

Figure 8A:
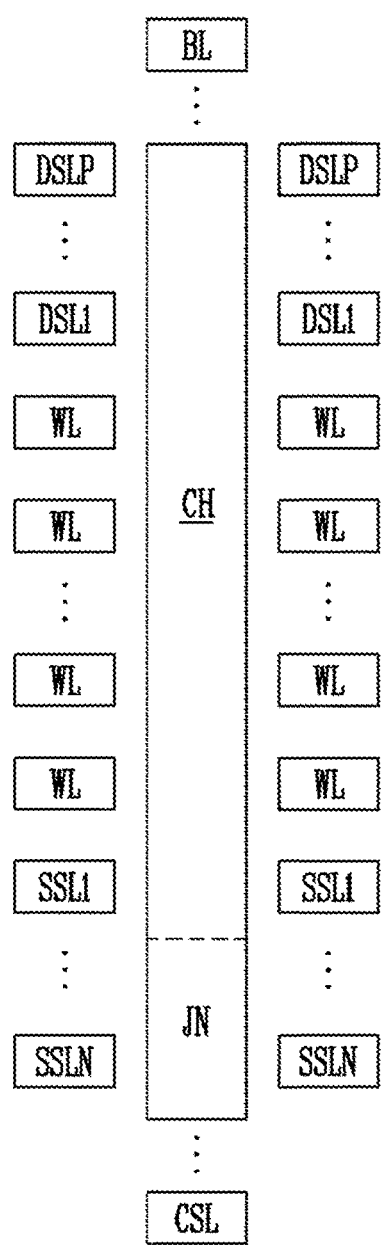
FIGS. 8A to 8C show cross-sectional diagrams illustrating the structure of a semiconductor device, according to an embodiment of the present disclosure.
Figure 8B:
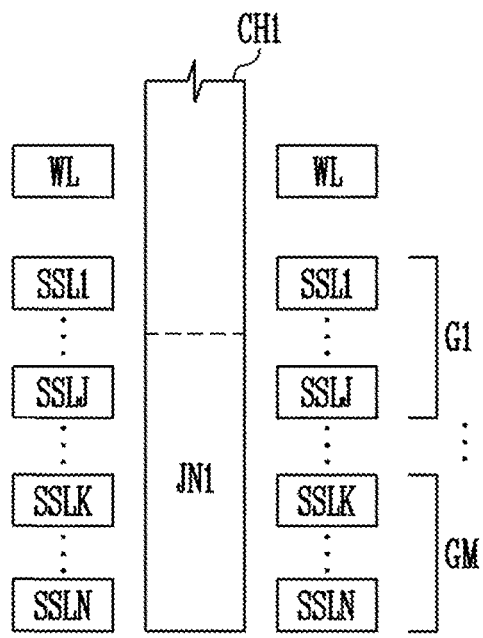
Figure 8C:
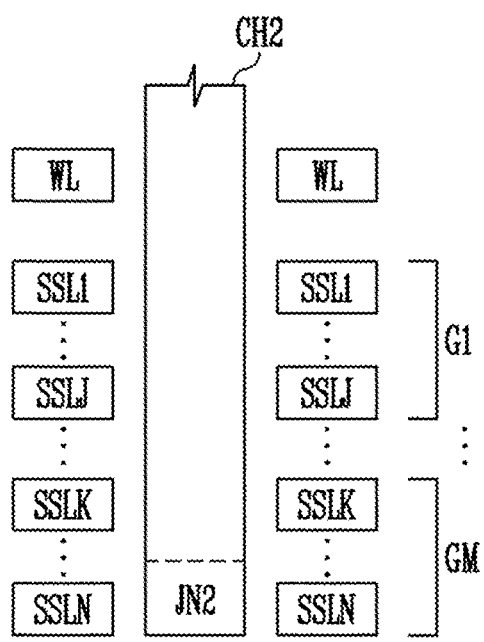

FIGS. 8A to 8C show cross-sectional diagrams illustrating the structure of a semiconductor device according to an embodiment of the present disclosure.

Referring to FIG. 8A, a semiconductor device, according to an embodiment, may include the source selection lines SSL1 to SSLN, the word lines WL, the drain selection lines DSL1 to DSLP, and a channel layer CH. For example, the semiconductor device may include conductive layers and insulating layers stacked alternately with each other, and the conductive layers may be the source selection lines SSL1 to SSLN or the drain selection lines DSL1 to DSLP.

For example, one or more upper layers of the conductive layers may be the drain selection lines DSL1 to DSLP, one or more lower conductive layers may be the source selection lines SSL1 to SSLN, and the remaining conductive layers may be the word lines WL. In this example, the channel layer CH may pass vertically through a stacked structure, a bottom portion of the channel layer CH may be coupled to the common source line CSL, and a top portion of the channel layer CH may be coupled to the bit line BL.

In another example, one or more upper conductive layers may be the drain selection lines DSL1 to DSLP and the source selection lines SSL1 to SSLN, at least one lower conductive layer may be a pipe gate, and the remaining conductive layers may be the word lines WL. In this example, the channel layer CH may have a "U" shape, one end portion of the channel layer CH may be coupled to the common source line CSL, and the other end portion of the channel layer CH may be coupled to the bit line BL.

The channel layer CH may pass through the source selection lines SSL1 to SSLN, the word lines WL, and the drain selection lines DSL1 to DSLP. For example, after an opening is formed through the stacked structure, the channel layer CH may be formed in the opening. Therefore, the channel layer CH may be formed by a deposition method, a selective growth method, or the like. In addition, the channel layer CH may include a semiconductor material such as silicon (Si), germanium (Ge), or the like. For example, the channel layer CH may be formed by depositing or growing an undoped polysilicon layer in the opening.

The source selection transistor, the memory cells, and the drain selection transistor may be stacked along the channel layer CH and share the channel layer CH. Therefore, a junction JN may be formed by doping the channel layer CH with impurities in order to control characteristics of a transistor. For example, the junction JN may be formed at a position corresponding to the source selection transistor or the drain selection transistor.

The junction JN may be formed in the channel layer CH by diffusion of the impurities using a heat treatment process. For example, an area corresponding to the memory cells of the channel layer CH may be an undoped polysilicon layer not doped with impurities, and an area corresponding to the source selection transistor or the drain selection transistor may be a doped polysilicon layer doped with impurities.

When the channel layers CH are formed in the stacked structure, impurities may be diffused in different levels in the respective channel layers CH due to processing variables. FIG. 8B shows that impurities are sufficiently diffused in a first channel layer CH1. All source selection transistors of the first to Mth groups G1 to GM may overlap a first junction JN1. On the other hand, FIG. 8C shows that impurities are not sufficiently diffused in a second channel layer CH2. Some of the source selection transistors of the first to Mth group G1 to GM may not sufficiently overlap a second junction JN2. Particularly, because an impurity concentration decreases toward the top of the second junction JN2 because of characteristics of a diffusion process, the source selection transistors of the first group G1 located at the top may not sufficiently overlap the second junction JN2, or an impurity concentration of the second junction JN2 may not be high enough.

As a result, because a sufficient amount of holes are not generated from the source selection transistors of the first group G1, an erase speed may be reduced, or an erase failure may occur. Therefore, an erase operation may be improved by increasing a GIDL current of the second group G2. In other words, a floating time of the second group G2 which is located at a relatively low position or which sufficiently overlaps the junction may be delayed. As described above, a shortage in the first group G1 may be compensated by increasing the amount of holes generated by the source selection transistors of the second group G2.

In addition, threshold voltages of the selection transistors of the first group G1 which do not sufficiently overlap the second junction JN2 may be increased because charges are trapped in gate insulating layers due to HCI. Therefore, a threshold voltage variation caused by the HCI may be prevented by increasing a GIDL bias by delaying the floating times of the source selection lines SSL1 to SSLJ of the first group G1.

Figure 9:
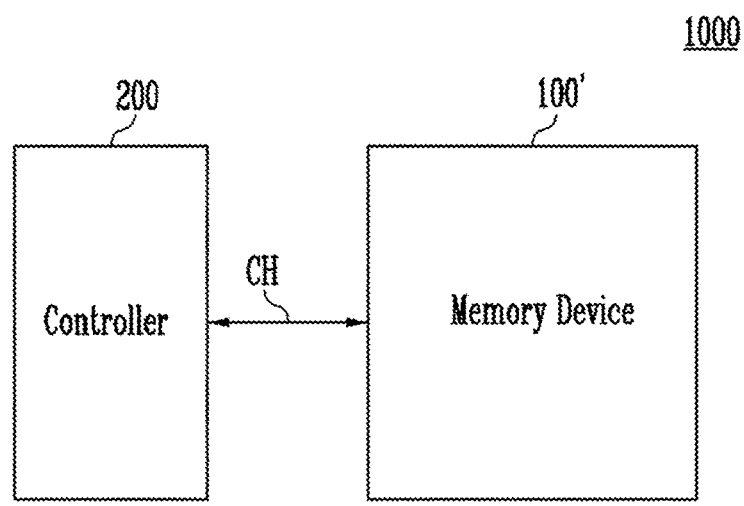
FIG. 9 shows a block diagram illustrating the configuration of a memory system, according to an embodiment of the present disclosure.

FIG. 9 shows a block diagram illustrating a configuration of a memory system 1000, according to an embodiment. Referring to FIG. 9, the memory system 1000 may include a memory device 100' and the controller 200.

The controller 200 may control the memory device 100' through a channel CH, and the memory device 100' may operate in response to control of the controller 200. The memory device 100' may include a memory cell array including a plurality of memory blocks. According to an embodiment, the memory device 100' may be the above-described semiconductor device 100 or a flash memory device.

The controller 200 may command that the memory device 100' perform a predetermined operation in response to a request from a host (not shown). In addition, the memory device 100' may receive a command and an address from the controller 200 through the channel CH and may access an area selected from the memory cell array in response to the address. In other words, the memory device 100' may perform an internal operation corresponding to a command on the area selected by the address.

The controller 200 may control the memory device 100' to perform a program operation, a read operation, or an erase operation. During the program operation, the controller 200 may provide a program command, an address, and data to the memory device 100' through the channel CH, and the memory device 100' may program the area selected by the address with data. During the read operation, the controller 200 may provide a read command and an address to the memory device 100' through the channel CH and read data from an area selected by the address. This read operation may include a read operation serving as verification entailed by a program or erase operation as well as a read operation performed to read and output data stored in a memory cell.

During the erase operation, the controller 200 may provide an erase command and an address to the memory device 100' through the channel CH, and the memory device 100' may erase data stored in the area selected by the address.

The memory device 100' may group source selection lines or drain selection lines, and may float the respective groups at different times, or apply different GIDL biases to the respective groups. GIDL currents of some selection transistors may be increased, or deterioration of the selection transistors may be prevented. Therefore, erase operation characteristics and reliability of the memory device 100' may be improved.

Figure 10:
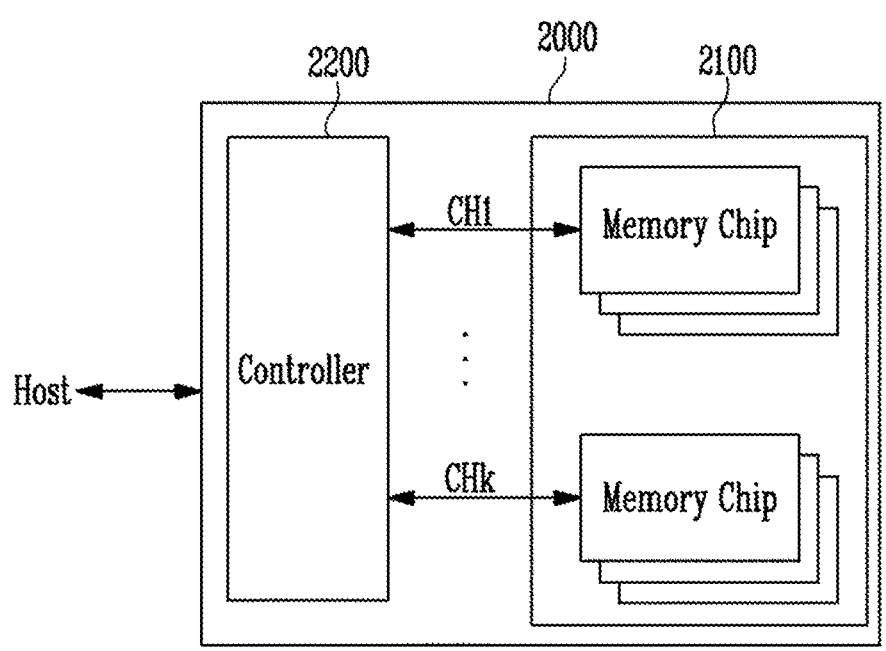
FIG. 10 shows a block diagram illustrating the configuration of a memory system, according to an embodiment of the present disclosure.

FIG. 10 shows a block diagram illustrating a configuration of a memory system 2000, according to an embodiment. Referring to FIG. 10, the memory system 2000 may include a memory device 2100 and a controller 2200.

The memory device 2100 may be a semiconductor device and include a plurality of memory chips. The semiconductor memory chips may be divided into a plurality of groups. The plurality of groups may communicate with the controller 2200 through first to kth channels CH1 to CHk. Each of the memory chips may be configured and operated in substantially the same manner as the semiconductor device 100 described above with reference to FIG. 1.

Each group may be configured to communicate with the controller 2200 through a single common channel. The controller 2200 may be configured in substantially the same manner as the controller 200 described above with reference to FIG. 9, and may be configured to control the plurality of memory chips of the memory device 2100 through the plurality of channels CH1 to CHk. The memory system 2000 may be modified so that a single memory chip may be coupled to a single channel.

The controller 2200 and the memory device 2100 may be integrated in one semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 2200 and the memory device 2100 may be integrated in a single semiconductor device to form a solid state drive (SSD). The SSD may include a storage device for storing data in a memory. When the memory system 2000 is used as an SSD, operational rates of the host coupled to the memory system 2000 may be significantly improved.

In another example, the memory system 2000 may be provided as one of various elements of an electronic device such as a computer, a ultra-mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture player, a digital picture recorder, a digital video recorder, a device capable of transmitting/receiving information in an wireless environment, one of various devices for forming a home network, one of various electronic devices for forming a computer network, one of various electronic devices for forming a telematics network, an RFID device, or one of various elements for forming a computing system, or the like.

Figure 11:
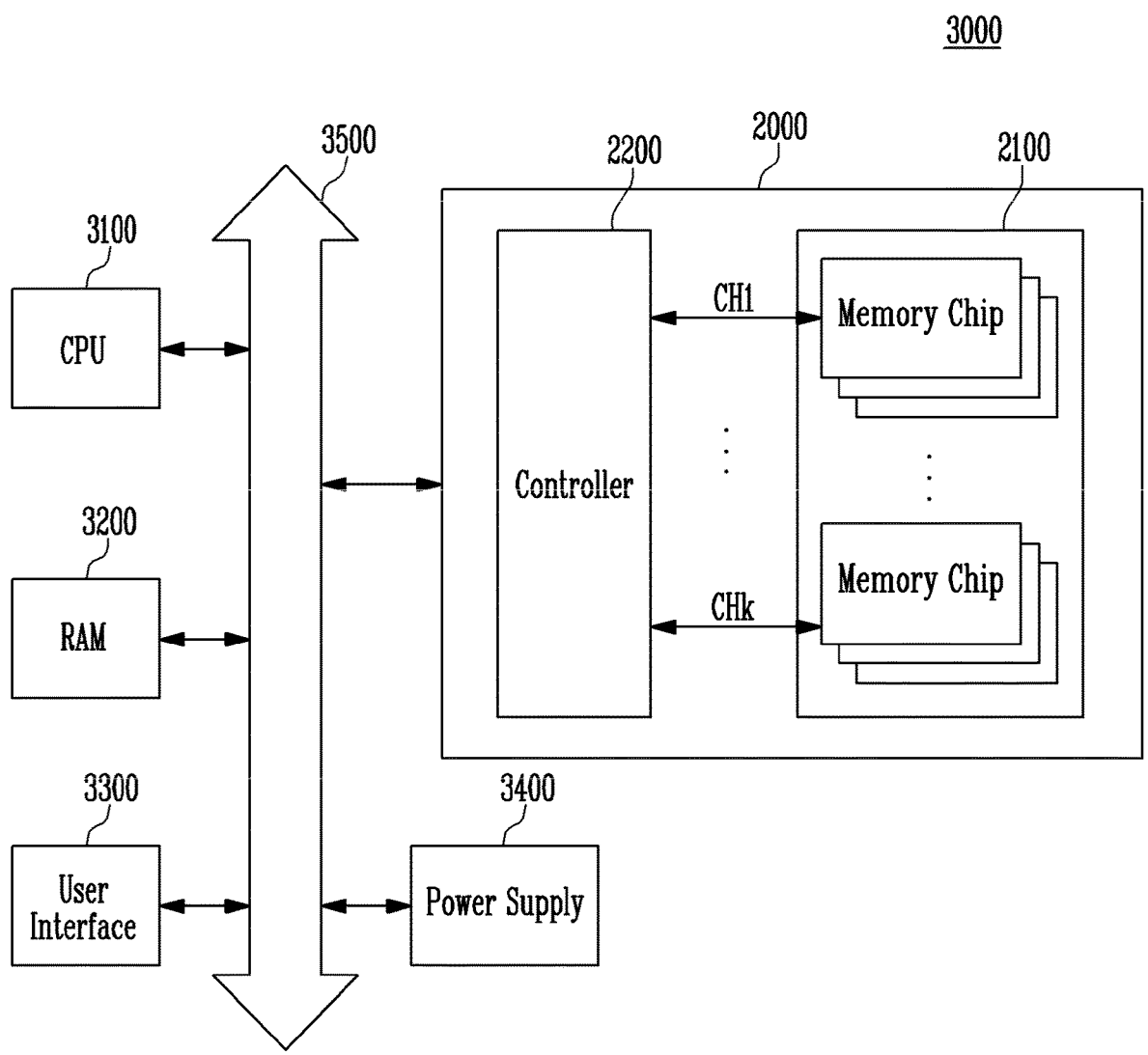
FIG. 11 shows a block diagram illustrating the configuration of a computing system, according to an embodiment of the present disclosure.

FIG. 11 shows a block diagram illustrating a configuration of a computing system 3000, according to an embodiment. Referring to FIG. 11, the computing system 3000 may include a central processing unit 3100, a Random Access Memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 shown in FIG. 10 or the memory system 1000 shown in FIG. 9. In addition, the computing system 3000 may include both of the memory systems 1000 and 2000 described above with reference to FIGS. 9 and 10.

According to embodiments, erase operation characteristics may be improved, and reliability may be improved.

It will be apparent to those skilled in the art that various modifications can be made to the above-described embodiments without departing from the spirit or scope of the present teachings. Thus, it is intended that the present teachings cover all such modifications provided they come within the scope of the appended claims and their equivalents.

Embodiments of the present disclosure have been described with reference to the accompanying drawings. Specific terms or words used in the description should be construed in accordance with the spirit of the present disclosure without limiting the subject matter thereof. It should be understood that many variations and modifications of the teachings described herein will still fall within the spirit and scope of the present disclosure as defined in the accompanying claims and equivalents thereof.

What is claimed is:

1. A semiconductor device comprising:
   a memory string coupled between a common source line and a bit line, the memory string comprising at least one first selection transistor, memory cells, and second selection transistors;
   selection lines individually coupled to the second selection transistors; and
   a control logic circuit configured to float a first group of selection lines from among the selection lines at a first time and configured to float a second group of selection lines from among the selection lines at a second time different from the first time,
   wherein the first group of selection lines and the second group of selection lines are included in a selected memory block for an erase operation.

2. The semiconductor device of claim 1, wherein when the first group of selection lines is closer to the common source line than the second group of selection lines the first time occurs before the second time.

3. The semiconductor device of claim 1, wherein when the first group of selection lines is closer to the common source line than the second group of selection lines the first time occurs after the second time.

4. The semiconductor device of claim 1, wherein when the first group of selection lines is closer to the bit line than the second group of selection lines the first time occurs before the second time.

5. The semiconductor device of claim 1, wherein when the first group of selection lines is closer to the bit line than the second group of selection lines the first time occurs after the second time.

6. The semiconductor device of claim 1, wherein the control logic circuit floats the second group of selection lines after floating the first group of selection lines, and wherein the second group comprises fewer selection lines than the first group.

7. The semiconductor device of claim 1, wherein the control logic circuit floats the second group of selection lines after floating the first group of selection lines, and a gate induced drain leakage (GIDL) bias applied to the second group of selection lines is greater than a GIDL bias applied to the first group of selection lines.

8. The semiconductor device of claim 1, wherein a number of selection lines included in the first group is different from a number of selection lines included in the second group.

9. The semiconductor device of claim 1, wherein a gate induced drain leakage (GIDL) current generated by second selection transistors, from among the second selection transistors, corresponding to the second group of selection lines is increased by delaying the second time to float the second group of selection lines.

10. The semiconductor device of claim 1, wherein the control logic circuit floats the first group of selection lines and the second group of selection lines in a period during which a voltage level of at least one of the common source line and the bit line rises by applying an erase voltage.

11. A semiconductor device comprising:
a memory string coupled between a common source line and a bit line, the memory string comprising at least one first selection transistor, memory cells, and second selection transistors; and
a control logic circuit configured to apply an erase voltage to at least one of the common source line and the bit line, configured to apply a first gate induced drain leakage (GIDL) bias to a first group of second selection transistors from among the second selection transistors by floating selection lines coupled to the first group of second selection transistors, and configured to apply a second GIDL bias different from the first GIDL bias to a second group of second selection transistors from among the second selection transistors by floating selection lines coupled to the second group of second selection transistors,
wherein the first group of second selection transistors and the second group of second selection transistors are included in a selected memory block for an erase operation.

12. The semiconductor device of claim 11, wherein the first GIDL bias represents a voltage difference between gate terminals and source terminals of the second selection transistors of the first group, and wherein the second GIDL bias represents a voltage difference between gate terminals and source terminals of the second selection transistors of the second group.

13. The semiconductor device of claim 11, wherein the control logic circuit floats the selection lines coupled to the first group of second selection transistors and the selection line coupled to the second group of second selection transistors in a period during which a voltage level of at least one of the common source line and the bit line rises by applying the erase voltage.

14. The semiconductor device of claim 13, wherein the control logic circuit floats the selection lines coupled to the second group of second selection transistors after floating the selection lines coupled to the first group of second selection transistors, and wherein the second GIDL bias is greater than the first GIDL bias.

15. The semiconductor device of claim 13, wherein the control logic circuit floats the selection lines coupled to the second group of second selection transistors after floating the selection lines coupled to the first group of second selection transistors, and wherein the second group comprises fewer second selection transistors than the first group.

16. The semiconductor device of claim 11, wherein a number of second selection transistors included in the first group is different from a number of second selection transistors included in the second group.

17. A method of operating a semiconductor device comprising memory strings coupled between a common source line and a bit line, the memory strings each comprising at least one first selection transistor, memory cells, and second selection transistors, the method comprising:
applying an erase voltage to at least one of the common source line and the bit line;
floating, at a first time, a first group of selection lines from among selection lines individually coupled to the second selection transistors; and
floating, at a second time different from the first time, a second group of selection lines from among the selection lines individually coupled to the second selection transistors,
wherein the first group of selection lines and the second group of selection lines are included in a selected memory block for an erase operation.

18. The method of claim 17, wherein the second group of selection lines is floated after floating the first group of selection lines, and wherein the second group comprises fewer selection lines than the first group.

19. The method of claim 17, wherein the second group of selection lines is floated after the first group of selection lines is floated, and a gate induced drain leakage (GIDL) bias applied to the second group of selection lines is greater than a GIDL bias applied to the first group of selection lines.

20. The method of claim 17, wherein a number of selection lines included in the first group is different from a number of selection lines included in the second group.

* * * * *